United States Patent [19]
Irwin et al.

[11] Patent Number: 5,767,744
[45] Date of Patent: Jun. 16, 1998

[54] LIGHTWEIGHT FIXED FREQUENCY DISCONTINUOUS RESONANT POWER SUPPLY FOR AUDIO AMPLIFIERS

[75] Inventors: Gordon L. Irwin, Bothell, Wash.; Patrick H. Quilter, Laguna Beach, Calif.

[73] Assignee: QSC Audio Products, Inc., Costa Mesa, Calif.

[21] Appl. No.: 753,185

[22] Filed: Nov. 21, 1996

Related U.S. Application Data

[60] Provisional application No. 60/007,460, Nov. 22, 1995.

[51] Int. Cl.$^6$ .................................................. H03F 1/30
[52] U.S. Cl. .......................... 330/297; 330/289; 330/298; 363/24
[58] Field of Search ........................... 330/123, 202, 330/207 P, 267, 273, 289, 297, 298; 363/24, 31

[56] References Cited

U.S. PATENT DOCUMENTS 4,318,164   3/1982   Onodera et al. ................. 330/297 X
5,499,154   3/1996   Cullison.

*Primary Examiner*—James B. Mullins
*Attorney, Agent, or Firm*—Harold L. Jackson

[57] ABSTRACT

A power supply of the high frequency series resonant mode family for supplying power to audio amplifiers includes half and full bridge variations and supplies all of the required rail voltages while maintaining fixed frequency resonant operation throughout all combinations of loading of the amplifier outputs without the need for a large explicit resonant inductance. The elimination of switching loss enables the use of power supply switching devices optimized for low conduction loss, further improving performance under high current conditions. The power supply frequency is fixed by an oscillator of sufficient precision to ensure that the beat frequency that will result from heterodyning of the residual switching frequency noise between two identical but separate power supplies will be in the infrasonic range. Protection circuitry is provided to limit peak switch currents during the start up interval. The power supply and power amplifier protection functions are interlinked, resulting in simplified protection against short and long term current overloads, thermal overloads, output load shorts, and amplifier faults leading to DC outputs. The intended application is the reproduction of audio signals, which have a high crest factor, requiring the ability to deliver high short term power levels from a given set of components.

29 Claims, 3 Drawing Sheets

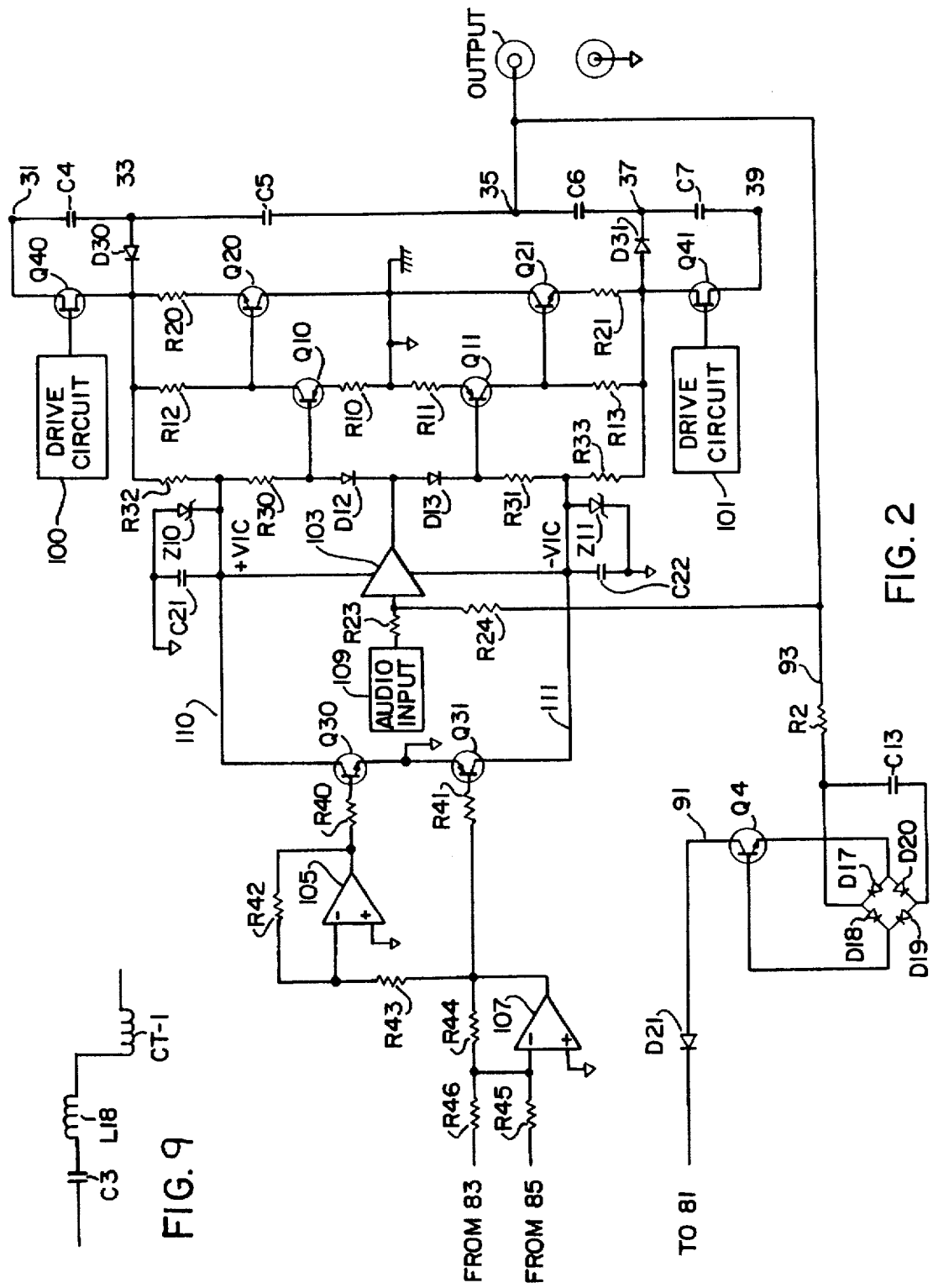

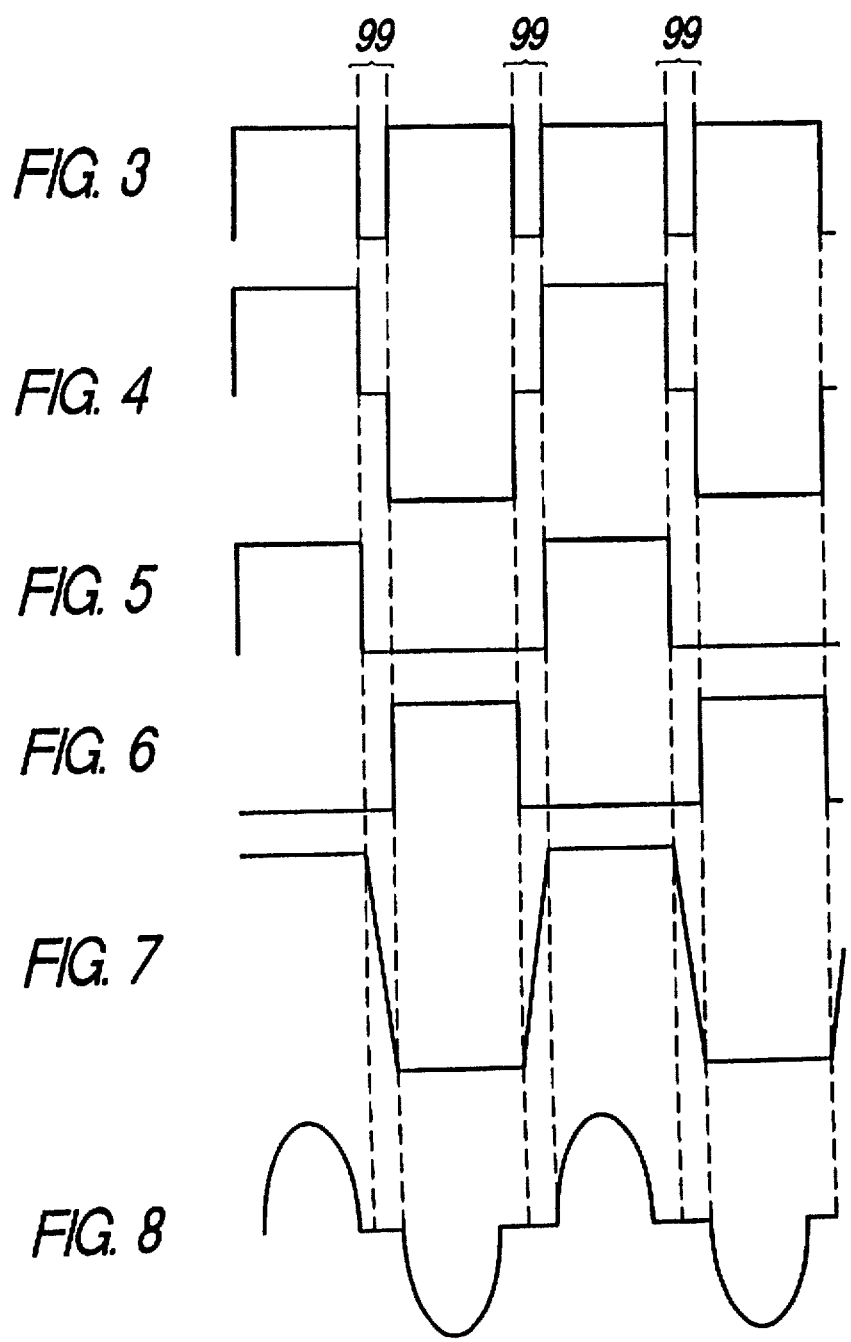

LIGHTWEIGHT FIXED FREQUENCY DISCONTINUOUS RESONANT POWER SUPPLY FOR AUDIO AMPLIFIERS

RELATED APPLICATION

This application is a complete application based on U.S. provisional application bearing application Ser. No. 60/007,460 filed Nov. 22, 1995 and entitled "LIGHTWEIGHT AUDIO AMPLIFIER WITH FIXED FREQUENCY RESONANT POWER SUPPLY."

FIELD OF THE INVENTION

The present invention relates to a power supply for audio frequency power amplifiers, and more particularly, to the use of a high frequency switching power supply with multiple-tiered DC outputs, and effective overload-limiting circuitry, to supply DC power to the amplifier output devices for superior circuit performance and safety along with a lighter, more efficient equipment package.

BACKGROUND OF THE INVENTION

In conventional combined high power audio amplifiers and power supplies, the unit's weight is dominated by the power supply for the audio circuitry, and in particular, the 50–60 Hz AC isolation transformer which scales the AC mains voltage prior to rectification and which provides safety isolation from the AC mains. The next largest source of weight is the large heat sink required for the audio output devices, which typically generate high losses when delivering varying audio voltages and currents from a fixed, high voltage DC supply. Lesser sources of weight include the large DC filter capacitors which are required to store energy between the peaks of the rectified AC voltage.

Since the weight and size of an isolation transformer is inversely proportional to its frequency of operation, the use of a higher operating frequency will result in a smaller transformer. However, operation at high frequency has presented another set of problems which has heretofore made the designs of such power supplies prohibitive.

Prior art high frequency power supplies typically comprises a voltage rectifier connected to the AC mains (i.e., 120v or 230v AC), a DC filter capacitor of sufficient size to smooth the voltage, and one or more high frequency switching transistors which switch the DC voltage at a frequency much higher than the AC mains frequency (e.g., 60 Hz), generally above 20 kHz. This high frequency voltage is then passed through a relatively small isolation transformer, whose output is then rectified and filtered to provide the final, isolated DC voltage supply for the amplifier. Frequently, additional magnetic components, and control circuitry which varies the on-off ratio, are provided for regulating the final DC voltage to maintain a constant value despite variations in AC mains voltage and/or load.

Known problems in the prior art of high frequency supplies for audio amplifiers include switching losses, electromagnetic interference ("EMI"), maintenance of desired voltage regulation over a wide range of loads including zero load, maintaining desired voltage ratios, or cross-regulation, between different sections of the DC supply, damage to the active and passive components from destructive overloads, and providing for short-term power peaks without incurring the cost and weight penalties of continuous operation at such powers.

One common problem in the prior art is switching losses. The transistors have minimal losses when fully on or off, but transitions between these states generate high losses due to the simultaneous presence of high voltages and currents across the transistor. Typically, these losses are proportional to the switching frequency. As a result, there is an upper frequency limit at which high frequency transformance can effectively and efficiently be performed.

One possible solution uses field effect transistors for their fast switching capability. However, these devices are costly, and exhibit high conduction loss, which increases with temperature, limiting maximum current capability and increasing losses at high power.

Another solution is the continuous mode, series resonant power supply. A high power inductor and capacitor are placed in series with the input to the transformer, with values chosen to change the switched current waveform from its usual shape of a square wave to a resonant sinusoidal waveform, with switching performed at a zero crossing. Thus the transistors are able to switch at zero current) so that the switching losses are reduced or essentially eliminated. Since the period of the switched waveform is determined by passive resonant components, this class of circuits must be controlled by varying the switching frequency, to allow larger or smaller intervals between the fixed pulses of energy. This variable frequency operation seriously complicates the design of the line filter which is used to block the switching frequencies from entering the AC mains or the DC output of the power supply, and at light load, the switching frequency may drop well below 20 kHz, creating audible noise in the amplifier. Since the energy transfer occurs in the form of pulses of fixed energy, the supply voltage is likely to escalate at very light loads, if the pulse repetition rate cannot be sufficiently reduced, and erratic aperiodic operation is likely.

Audio amplifiers operate over an extremely wide dynamic range, and are expected to withstand accidental overloads such as shorted outputs without damage. Furthermore, users expect that gross failures in the amplifier will not damage their loudspeakers by dumping uncontrolled amounts of DC power into them. This normally requires power supplies capable of full regulation, or expensive auxiliary circuitry. In conventional amplifiers using AC mains transformers, further complications are encountered. Not only is the transformer a passive device incapable of protecting itself, but the DC energy storage is necessarily all on the secondary side, which means there may be a damaging amount of energy stored even if the transformer is shut off by some external means in response to a fault.

AC mains transformers, as conventionally used, will automatically solve other problems so long as acceptance of the drawbacks associated with a massive transformer can be tolerated. Large transformers have sufficient mass that short term peaks and overloads are readily absorbed, even when sustained for several minutes, thus yielding a desirably high peak power capability relative to their long-term rating. Cross regulation is good, but load regulation is degraded due to the resistance of the large windings, and line regulation is absent.

Other problems common to AC mains transformers include generation of large magnetic fields, leading to hum pickup at AC line frequencies, and a tendency to saturate at minimum rated AC frequency and high line voltage, making it uneconomical to serve world-wide markets with a single design.

There is a need for a lightweight, efficient and versatile power supply for audio amplifiers having safety features to prevent damage to the supply in the event of anticipated overload and fault conditions.

SUMMARY OF THE INVENTION

A power supply in accordance with the present invention employs a multiple output discontinuous mode fixed frequency series resonant topology for maintaining lossless switching for all combinations of line voltages and load currents, without need for a large resonant inductor. Multiple levels of DC supply are provided for more efficient operation of the audio amplifier. The audio amplifier circuitry is controlled in such a manner as to overcome the inability of the power supply to regulate under load, and to protect the power supply against prolonged overloads. The power supply is controlled to protect the user's load against gross failures of the audio amplifier. The supply can be operated from 120V or 230V AC mains by means of a simple wiring change, and accepts 50 Hz or 60 Hz AC input without appreciable changes in performance.

The rectified AC mains voltage is applied across one or more primary storage capacitors which in turn are connected to the primary winding of a power or isolation transformer via a high frequency switching circuit utilizing switching transistors, for example. The switching transistors operate in a push pull mode at a fixed frequency. One or more secondary storage capacitors are connected across secondary windings of the isolation transformer via output rectifiers to supply power to the audio amplifier channels.

The high frequency switching circuit utilizes the parasitic inductances of the power transformer and optionally small primary and/or secondary filter inductors to eliminate the need for further inductance. A high current series resonant capacitor is placed in series with the input to the transformer. When one of the switching transistors changes state (i.e., from nonconducting to conducting) at the beginning of its switching period, the voltage is coupled by the transformer to the secondary side storage or filter capacitors, which typically require some replenishing to maintain power to the amplifier channels. The presence of the series inductance prevents the current from rising suddenly; it ramps up smoothly at a rate determined by the difference between the input voltage and the reflected secondary storage capacitor voltage, and the net series inductance. This current gradually charges the resonant series capacitor, until its voltage begins to oppose the further flow of current. The current then diminishes smoothly to zero, completing a current pulse in the form of a half sine wave. The output rectifiers then stop conducting, and the voltage remains static until the end of the switching period. This shortly occurs, and the transistor is able to change state losslessly due to the absence of current, after which the operation repeats itself with the other transistor conducting current of the opposite polarity.

The "dead time" before the next switching transition must be minimized for most efficient operation. However, due to the variance in reflected inductance, which depends on how many of the secondary sections are loaded, the resonant period is longer when only one section is loaded, which occurs for instance, for low output signals. The value of the series resonant capacitor is chosen to barely complete a half cycle under these conditions before switching occurs, thus reducing the dead time to essentially zero at the high inductance extreme. This maintains the current as nearly sinusoidal as possible over the full range of loading, thus increasing the efficiency of the power transfer and decreasing the generation of EMI. The high inductance extreme occurs only at lower powers, which precludes the possibility of encountering switching loss at full loads.

The virtual elimination of switching loss enables improvement of load regulation and reduction of conduction losses by utilizing a class of switching devices which are optimized for low conduction loss, rather than high switching speed. Such devices include the IGBT (Insulated Gate Bipolar Transistor), which are not normally considered suitable for switching at frequencies exceeding 100 kHz, which is desired to minimize the size of the power transformer.

Further, the constant frequency operation also enables the use of precision crystal oscillators in the control system, which ensure that any beat frequency which may result from the heterodyning of the residual switching frequency noise between two identical but separate power supplies will be in the infrasonic range. This technique increases the compatibility of several power supplies within a single unit and precludes spurious audio-band noises when many amplifiers are used in proximity.

The previous problems with using discontinuous mode fixed frequency series resonant topology are eliminated in the embodiment of the present invention. Since it is necessary to wait for essentially the entire switching period to occur before the next transition, it is not safe to attempt to reduce output voltage by switching off early, since this would force a transition while large currents are still flowing, leading to destructive switching losses unless current is severely limited. Switching must either be halted entirely, or maintained at full output. Compensating for this lack of flexibility is a key requirement. Since the output stage of an audio amplifier is effectively a post-regulator, it can be made to compensate for lack of line regulation, and can also be made to limit the current during overloads, duplicating the effect of "voltage foldback". The power supply is preferably provided with a current monitoring sensor, which in this topology, can only be used to command a full shutdown, since intermediate degrees of voltage reduction are not feasible. This would entail a complete shutdown of the audio output. In the present invention, detection of moderate overload currents causes the amplifier's output current to be reduced, thus reducing the load on the power supply to safe limits without requiring a shutdown. This reduction can occur after a short delay, permitting normal program peaks to pass at full power without requiring the supply to withstand this power continuously. Power supply shutdown is used only in the event that the amplifier fails to respond to a current limiting signal.

Also, the power amplifier current limit may be made a function of device temperature, allowing progressively less current to be drawn from the supply as the devices in the power supply or power amplifier are heated. Proper application of this technique would result in the availability of the maximum current that is safe to allow at any given temperature. A simpler application provides only for excess temperature shutdown. In all cases, the load on the supply is removed by limiting or muting the audio amplifier, thus permitting the supply to continue operating at light load, in order to maintain power to cooling fans and other auxiliary circuitry.

The design of the present invention allows a gentle ramp-up of DC secondary voltage upon start-up. During steady state operation, the duty cycle must be constant, as described above, during which time very high currents can safely be handled. However, upon start up, large, non-resonant mode inrush currents are likely, that could damage the switching devices. Therefore the initial duty cycle is increased from zero to maximum by a relatively long ramp function, allowing the secondary capacitors to be gradually charged at a low current level. During this time the amplifier is held in a muted state, preventing any load from being placed on the supply until full voltage is reached. If, during the start up period, there is an unintentional low impedance in the amplifier circuit such as a shorted output device, a shorted diode in the output rectifier bank, a shorted winding on the power transformer, etc., the switch current will be in excess of the normal modest start up current, a condition more easily detected than with respect to a full-on, non-ramped start. Therefore, the ramp-up can be interrupted, and the supply held to safe currents, without experiencing destructive surges.

The power supply has capacitive energy storage on the primary side and on the secondary side. The bulk of the capacitive storage is provided on the primary side, with the secondary capacitance used mainly for high frequency ripple attenuation. This distribution of capacitance results in several advantages.

The primary side capacitors have much higher voltage ratings than the usual secondary voltages; such capacitors, using known construction techniques, have higher energy storage capability, allowing adequate filtering of the rectified AC with physically smaller and lighter units.

A further advantage occurs due to overcoming a subtle interaction between a conventional power supply and the amplifier circuitry at low frequencies. In a conventional power supply, with all energy storage on the secondary side, there are equal amounts of capacitance for the positive and negative supplies, which are recharged by the rectified AC at rates of 100 or 120 Hz. The undistorted output range of the amplifier is determined by the minimum voltage available from the capacitors, as they are discharged between AC peaks. When reproducing midband frequencies, say at 1 kHz, many positive and negative audio half-cycles are drawn between AC peaks, thus permitting the energy storage of both capacitor banks to be used. At very low frequencies, such as 20 Hz, the positive or negative half-cycle lasts long enough that only one of the capacitors is used for several AC cycles, thus loading it with twice the current compared to the midband case where currents are shared. This causes the ripple valleys to be about twice as large, reducing the available voltage, and causes the audio power at low frequencies to be less than midband power. The present invention overcomes this by transferring the energy from the entire primary energy reservoir, at a frequency well above the AC frequency, to secondary reservoirs, with good cross-regulation, so that even at low audio frequencies, the entire amount of primary energy storage is available at either secondary polarity; thus the loss of low frequency power is greatly minimized.

A further advantage is simplification of DC fault protection. The initial detection of a DC fault can use known techniques, such as a resistor-capacitor integrator placed across the output, which reaches a threshold voltage when the output voltage remains at a high DC level for a certain period of time. Since the energy storage on the secondary side is sufficiently small that it can be tolerated by a loudspeaker load in the event of a DC fault, the power supply need only cease supplying charging current to the output when a DC amplifier output condition is detected. Thus DC fault protection can be achieved by shutting down the power supply, rather than having to be concerned about sophisticated and speedy protection schemes downstream of the amplifier. This eliminates significant cost, and avoids the use of elements such as relays in series with the audio output, which might conceivably degrade the audio quality due to contact aging or pitting. Due to the aforementioned soft-start ramping function, the problem of restarting into a faulty load is prevented. Normally, when a power supply shutdown is used for DC fault protection, the amplifier must be designed to hold itself in the off condition indefinitely, or the circuitry, and load, must tolerate repeated attempts to restart into the fault, since the removal of power inherently removes the DC fault condition which initially triggered shutdown. The problem with the first option is that large signals just below the audio range, as might be generated by a dropped microphone or other transient condition, can drive an amplifier momentarily to full output, triggering the DC protection circuitry. It is desired that such "nuisance tripping" be self-resetting in the absence of an actual fault. Amplifiers which use latching circuitry to hold themselves off after DC faults require the user to intervene by recycling the power switch or the like. In the present invention, the action of the soft-start function described above limits the current into a fault to a safe level, unlikely to damage either the load or the remaining circuitry in the amplifier. In the event of a nuisance shutdown, the amplifier muting will permit resumption of normal operation within several seconds.

The reduced conduction losses, and elimination of switching loss, permits the supply to temporarily supply high peak currents without exceeding the short term ratings of the semiconductor devices. In a normal switching supply using field effect transistors, total losses are the sum of switching loss, which is proportional to output current, and conduction loss, which is proportional to the square of the output current multiplied by the drain-source resistance, which in itself is likely to double at maximum temperature due to its positive temperature coefficient and the self heating of the switching device. The result is that losses increase very rapidly at high currents, severely limiting the ability to deliver short term peaks above the long-term rating. It is essentially necessary to design such supplies for nearly the full peak current, even though typical program material will have an average power of $1/4$ to $1/8$ of peak levels. In the present invention, the elimination of switching loss permits the use of devices such as the IGBT, which have a conduction loss less than a comparable FET, with a curve more nearly proportional to current rather than the square of the current, and which increases much less with rising temperature. Therefore, the increase of loss at high currents is much less rapid, and there is minimal further rise due to self heating. When combined with the overcurrent limiting set forth above, it is feasible to pass full peak power for several seconds, while designing the supply for $1/3$ power continuous capability.

The invention, its configuration, construction, and operation will be best further described in the following detailed description, taken in conjunction with the accompanying drawings.

BRIEF DESCRIPTION OF THE DRAWINGS

FIG. 2 is an overall schematic view of a simplified version of the audio amplifier which is powered by the circuitry of FIG. 1;

FIG. 3 is an example of the voltage waveform of the comparator 65;

FIG. 4 is an example of the voltage waveform output of drive circuit 69;

FIG. 5 represents the periods where Q1 is driven into conduction;

FIG. 6 represents the periods where Q2 is driven into conduction;

FIG. 7 is an example of the voltage waveform from the switching elements Q1 and Q2 into the primary winding PRI of transformer 21;

7

Figure 1:
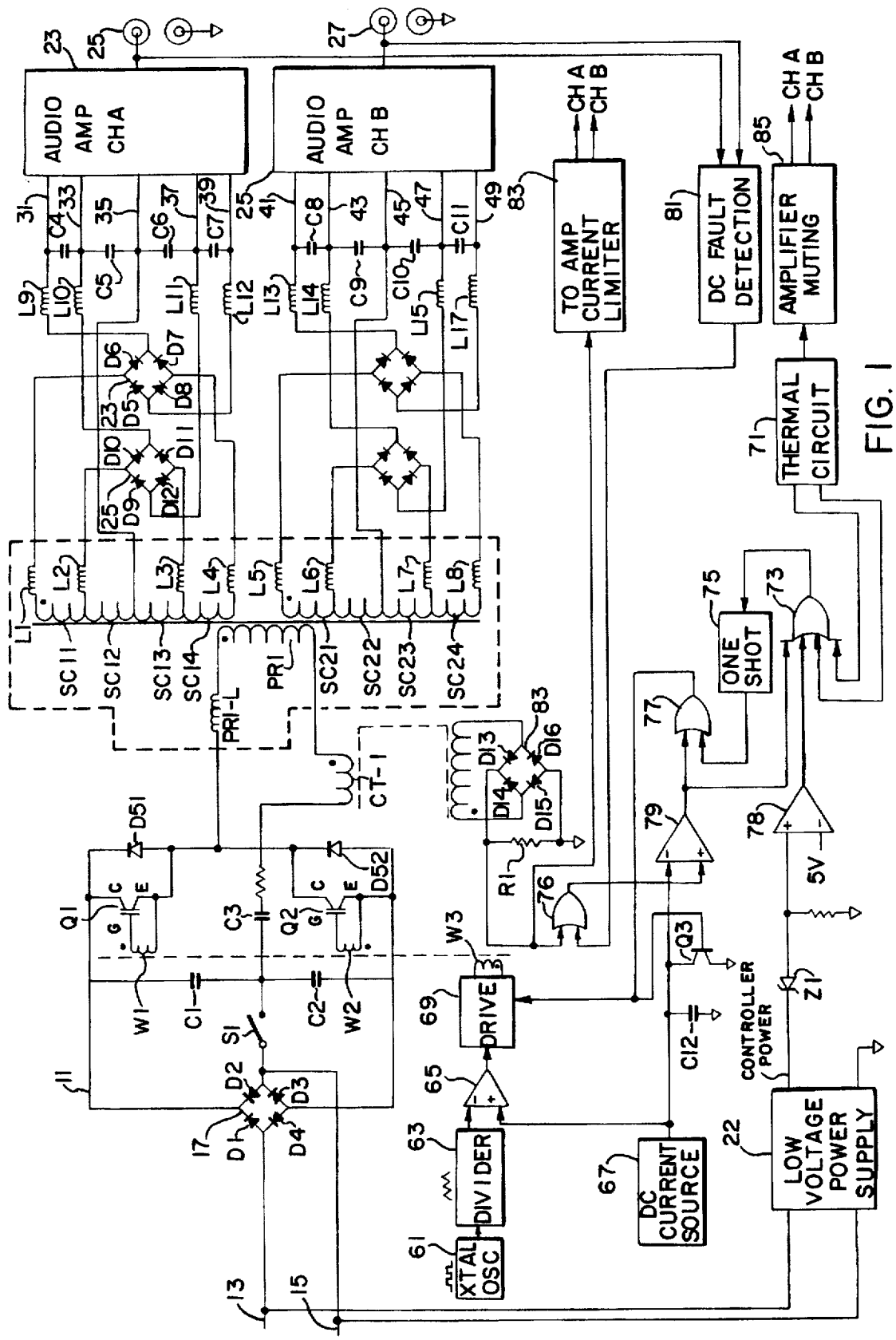
FIG. 1 is an overall schematic view of a simplified version of the power supply system of the present invention.

FIG. 8 is an example of the current waveform produced in the primary winding PRI and series resonant capacitor C3; and FIG. 9 is a schematic view of an explicit inductor L18 added in series with the series resonant capacitor C3 to the embodiment of FIG. 1.

DETAILED DESCRIPTION OF THE PREFERRED EMBODIMENT

FIG. 1 is a simplified overall schematic representation of the operation of the power supply section of the present invention. The power supply is referred to with the numeral 11 and may include all of the circuitry of FIG. 1, except for the power amplifier. The power supply is in the form of a series resonant half bridge with eight outputs, with the load intended to be a two channel, class H amplifier, a representative channel of which is shown in FIG. 2.

At the left side of the circuit, an alternating current voltage, typically from AC mains, is input onto lines 13 and 15. Switch S1 is closed for 120V operation and open for 230V operation. Bridge rectifier 17, having diodes D1, D2, D3 and D4, acts as a voltage doubler for 120V operation, and as a full wave rectifier for 230V operation, in either case providing a source of rectified DC for charging storage capacitors C1 and C2 to approximately 165 VDC each. Ideally the capacitors C1 and C2 are of identical capacity and may comprise several smaller capacitors connected in parallel, as is required by component availability and size restrictions. The capacitors C1 and C2 provide the main DC reservoir on the above described input side of the power supply.

It should be noted that a direct current power supply of suitable voltage may be connected across outer terminals of capacitors C1 and C2 in lieu of an AC main supply.

The positive end of capacitor C1, connected to the outputs of diodes D1 and D2, is connected to the collector of a transistor Q1, and to the output of a diode D5. The negative end of capacitor C2, connected to the inputs of diodes D4 and D3, is connected to the emitter of a transistor Q2 and to the input of a diode D6. The gate-emitter connection of transistors Q1 and Q2 each have a gate drive winding, namely gate drive windings W1 and W2, respectively. Transistors Q1 and Q2 are shown as IGBT types but other types of switching transistors can be substituted by one of ordinary skill in the art. The substitution of a full bridge transistor topology in place of the half bridge shown is also within the spirit and scope of this invention.

Drive windings W1, W2 and W3 form a gate drive transformer with the output windings W1 and W2 connected in opposite polarity, so that Q1 is turned off when Q2 is driven on, and Q2 is turned off when Q1 is driven on (see FIG. 5, FIG. 6). It is also possible for both Q1 and Q2 to be held off by a zero voltage output from the transformer, but it is not possible for Q1 and Q2 to be turned on at the same time, preventing destructive cross-currents. The drive voltage into W3 (see FIG. 4) is positive for about 45% of the entire switching cycle, which turns one of the switching devices on, then falls to zero for 5% of the cycle, turning the first switch off without turning the other on, then becomes negative for 45% of the cycle, turning the other switching device on, and returns to zero for the final 5%. In this manner, each switch is turned on for 90% of its half-cycle, followed by a 10% "dead time", where both switches are off. The exact amount of dead time is adjusted with respect to the turn off delay and fall times of the switches, but may conveniently be made larger than necessary to ensure safe

8 operation without affecting the essential operation of the scheme. The ability to use a simple gate drive transformer to couple these symmetrical signals from secondary-side control circuits to the primary side switches is a notable advantage of this scheme. Having the controller circuitry on the secondary side simplifies the connections between the amplifier and power supply controller which overcome the limitations of this power supply topology.

The alternating conductivity of transistors Q1 and Q2 (see FIG. 5, FIG. 6) delivers an AC voltage in the form of a square wave (see FIG. 7) to transformer primary winding PRI which has one end of primary PRI connected between the diodes D5 and D6, and the other end connected to a series resonant capacitor C3. The other end of capacitor C3 is returned to the common connection of capacitors C1 and C2. C3 must be rated to carry the entire current flow of the transformer primary.

The inductor PRI-L represents parasitic or leakage inductance between primary and secondary windings as a whole, and L1 through L8 represent the leakage inductance of each secondary winding. In addition, small, explicit inductors L9 thru L17 may be placed in series with each secondary tap for the purposes of minimizing radiated switching interference, comprising for example ferrite beads around each conductor, such ferrite beads forming saturable inductors. Inductors L9–L17, while not necessary to provide the resonant operation, when used, may contribute, i.e., up to about one-half of the net reflected inductance as seen by the resonant circuit including the series resonant capacitor C3. All of these inductances, as reflected back to the primary side, form a discontinuous resonant circuit with C3, which operates as follows: Transistor Q1 starts to conduct, coupling the positive voltage on C1 through the transformer to forward biasing bridge rectifiers 23 and 25, comprising rectifier diodes D5 thru D12. Channel B has similar bridge rectifiers as shown. This voltage thus reaches secondary filter capacitors C4 thru C11, which may conveniently be of similar value although that is not essential to the scheme. It should be noted that an explicit inductor L18 may be added in series with the resonant capacitor C3, if desired. See FIG. 9.

The series resonant capacitor C3 forms a resonant circuit at or slightly above the switching frequency with the leakage inductor between the primary and secondary windings and the inductance, if any, in series with the transformer windings, i.e., L9–L17 and L18, if used.

Assuming the presence of a load, at least one of the secondary filter capacitors will be slightly discharged, and therefore a replenishing current flows through the associated rectifier diode and inductance. The rate of rise of this current is limited by the net series inductance from the primary to the secondary, and sets the initial slope of the current waveform. As the current ramps up, the voltage across C3 increases, until it matches the voltage differential between the primary and secondary capacitor reservoirs. At this time, the current begins to ramp back down, again at a rate determined by the net series inductance, until it reaches zero (see FIG. 8). When it reaches zero, the output rectifiers cease to conduct, without appreciable reverse recovery losses, and the voltage on C3 stops changing.

The value of C3 is selected, with respect to the values of the inductances, so that this half-sine-wave cycle is completed shortly before Q1 is turned off. It will be appreciated that the voltage change required on C3 is not great, due to the small differential between input and output voltages, so the shape of the voltage waveform through the transformer is not greatly altered from that of a square wave. As noted above. Q1 turns off before Q2 turns on. There is minimal current flowing in Q1 when it turns off, mainly comprising the magnetizing current stored in the primary of the transformer 21. This modest current carries the voltage of the node between Q1 and Q2 from the positive to the negative supply rail, at a rate determined by the parasitic capacitance of Q1 and Q2. This fairly modest rate of voltage change materially reduces the generation of EMI, as well as enabling the switches to complete the voltage transition with essentially zero losses.

At the end of the dead time, Q2 is turned on, and the above resonant cycle repeats itself in exactly the opposite polarity. The salient features of this scheme are that the switches and transformer strongly couple the voltages of the primary reservoir to the secondary reservoir, for good regulation, while maintaining a smooth and orderly current waveform. The current flow is completed during each half cycle, with no energy carried forward to the next cycle. This minimizes the circulating current losses which characterize the ordinary series resonant supply. The amplitude of current automatically adjusts itself to replenish the load; if the load is zero, the secondary capacitors will not draw current and therefore no resonance occurs. Because the flow of current is completed and reaches zero before the end of each switching cycle, this supply is termed a discontinuous mode, series resonant power supply.

The power supply output lines are shown to the right. The voltages are determined by the turns ratio of the transformer 21, and the input voltage from C1 and C2. The output voltages in the present invention are arranged in bipolar, tiered banks, having a positive voltage 31, a positive voltage 33 of half this value, a center tap 35 or zero reference, a negative voltage 37 of half value, and a negative voltage 39 of full value. A second channel, B, duplicates these voltages 41, 43, 45, 47, and 49. These exact ratios are not essential to the scheme, but are conveniently obtained and suitable for feeding a 2-channel, Class H audio amplifier, as shown in FIG. 2. Preferred embodiments may use one, two, three or more tiers for each polarity, and may feed one or more channels per power supply, as determined by the output power requirements and desire for simplifying lower cost implementations. The good cross regulation of this scheme supports this flexibility of application. A class H amplifier is preferred for higher power embodiments, since the ability to draw power from the lowest possible voltage supply substantially reduces the wasted energy lost in the audio output devices and thus reduces the required heat sinking.

A capacitor C4 is connected between the outputs 31 and 33, a capacitor C5 is connected between the outputs 33 and 35, a capacitor C6 is connected between the outputs 35 and 37, and a capacitor C7 is connected between the outputs 37 and 39. It is also possible to connect capacitors from each line 31, 33, 37, 39 separately to the center tap 35, but the connection shown permits the convenient use of identical capacitors.

As each amplifier channel is loaded differently, and as the output transistors draw power from lower or higher tiers, one or more DC output sections are loaded, effectively placing one or more secondary inductances in parallel, as reflected to the primary. Thus the reflected inductance is largest when only a single section is loaded, and smallest when all sections are loaded. To secure safe operation, the value of C3 is set to just complete its resonant cycle when a single power supply tier is loaded, although as a practical matter, it is acceptable if the current does not quite reach zero since the power drawn under these conditions is well below the maximum. As additional tiers are loaded, the resonant cycle finishes earlier in the switching period, reaching zero safely before turnoff. The drawback to undersizing C3 is that the resonant pulse width when all sections are loaded become too small a percentage of the switching cycle, which increases peak current and thus conduction losses, so a balanced value of C3 is desired. To minimize this change in resonant period, it is desired to construct the transformer 21 so that more of the leakage inductance occurs between the primary and secondary as a whole, and thus changes less as a function of how many output sections are loaded.

During the transient condition of startup, the duty cycle and current limits are not fixed as they are during steady state operation. The duty cycle is determined by a pulse width modulator, e.g., (elements 61, 63, 65 and 67) shown in the lower left side of FIG. 1. A crystal oscillator 61 has an output which is electronically divided by logic circuitry incorporated into divider/sawtooth wave generator 63 to a frequency twice the desired switching frequency. In the preferred embodiment, the switching frequency is 115 kHz to reduce transformer core losses. The divided signal drives the sawtooth generator portion of component 63. The crystal oscillator is used to maintain frequency stability, which ensures that EMI and transformer core losses are predictable, and also ensures compatibility between supplies located in close proximity. The accuracy of the crystal is sufficient to ensure that any beat frequency which might be produced by the passing of two dissimilar switching frequencies through any nonlinear system capable of acting as a demodulator, lies below 20 Hz and is thus inaudible.

The divider/sawtooth generator 63 has a fixed upslope time equal to the steady state conduction period and a downslope time equal to the dead time. The output of the sawtooth generator has an output connected to the negative input of a comparator 65.

A DC current source 67 has an output connected to the positive side of the comparator 65, and to a capacitor C12, the other end of capacitor C12 connected to ground. Under steady state conditions, the comparator output is high at the start of the sawtooth and trips off when the sawtooth nears its peak, delivering a train of wide pulses with narrow spaces to drive circuit 69 (see FIG. 3). Drive circuit 69 uses a flip-flop to alternatively steer these pulses to matched gate drive buffers, dividing the switching frequency to its final value. The outputs of said gate drive buffers are connected to opposite ends of gate drive winding W3, creating a train of alternate positive and negative pulses (FIG. 4) separated by short periods at zero voltage, which is inductively linked to windings W1 and W2. Windings WI and W2 are connected with opposite polarity (FIG 5, FIG. 6) to alternatively drive transistors Q1 and Q2 into conduction, as described above. It will be appreciated that this scheme assures matched positive and negative pulses for symmetrical operation of the switches. Components 61, 63, 65, C12, 69 and the gate windings W1, W2, and W3 are collectively referred to sometimes hereinafter as the switching control circuit for controlling the switching transistors Q1 and Q2.

At start up, i.e., when terminals 13, 15 are connected to the AC source, the sawtooth generator starts, and DC current source 67 begins charging the initially discharged ramp capacitor C12. When C12 is low, the comparator reaches its trip voltage much sooner, and the pulses sent to 69 are very narrow, thus turning the switching transistors on only briefly and limiting the charging current. As C12 ramps up, the pulse width progresses toward its steady state value at a controlled rate, chosen such that neither the charging current nor the charging time is excessive. This makes the capacitor C12 charging time several orders of magnitude greater than the switching period.

In the preferred embodiment, the audio amplifier output transistors are muted, i.e., drive reduced, or held in cutoff, i.e., drive reduced to zero, during startup, with a time delay greater than that of the ramp-up on capacitor C12, to ensure that normal voltage and switching operation is reached before a load is placed on the supply. This will be described in FIG. 2.

The voltage on C12 is also used as the reference for overcurrent comparator 79. During the initial ramp up period, the reference voltage for overcurrent detection also ramps up from zero. Therefore the initial threshold for overcurrent detection, as explained below, is far lower than usual, starting at essentially zero. Unintentional loads on the supply during startup, which can only represent amplifier faults, are detected at a low current level and generate a shutdown signal for the power supply. As explained below, this resets the start up sequence, and the supply therefore periodically attempts to restart at a low, non-destructive current level.

The drive circuit 69 has a shutdown (or inhibit signal) input connected to several shutdown signals. A shutdown command (or switching elements inhibit signal) inhibits the drive circuit 69 (forming part of the switching elements control circuit) causing the transistor switches Q1 and Q2 to provide an open circuit and terminate current flow to the primary winding PR1. A shutdown command also triggers a reset transistor Q3 which discharges C12. This ensures that any supply shutdown resets the soft start sequence, thus leading to the desirable fault tolerance noted above.

One shutdown signal is from DC Shutdown or Fault Detection circuit 81, which has an output connected into the positive input of the comparator 79. A prolonged DC voltage (i.e., a voltage in existence in excess of a preset time duration) at the output of the amplifier causes a positive voltage signal to be transmitted to the comparator 79. If the magnitude of the positive voltage signal is larger than the voltage from the DC current source 67, a signal will flow through the OR gate 77 and trigger a shutdown in the drive circuit 69. This stops the switching and removes power to the amplifier. If the fault persists, restart energy is limited as described above.

Another shutdown signal is from thermal shutdown circuit 71. The thermal circuit 71 may combine the input from one or more thermal sensors which sense an overheated condition of the amplifier (and transformer); in this example two sensors are combined in OR gate 73. Sensors may conveniently be in the form of positive temperature coefficient resistors, made so their resistance increases rapidly at a characteristic temperature knee. When biased with a small current source, the increased resistance results in a rising voltage at a desired temperature limit. The output of the OR gate 73 is fed into a oneshot trigger 75, and then to an OR gate 77. The oneshot trigger maintains the shutdown signal for a period of time to allow the switching devices to cool down, and to ensure complete reset of the soft-start circuit. However, halting the power supply entirely as a response to general overheating of the amplifier is not desirable, as any auxiliary loads such as cooling fans (not shown) are also stopped. The present invention therefore directs the output from the thermal sensing circuit to circuit section 85, comprising a second comparator, which is operatively connected to a lower reference voltage, and which triggers a removal of all drive to the audio output circuit (see FIG. 2) before the power supply reaches its thermal limit, thus muting the amplifier and removing all normal sources of heat generation. The output signal from the circuit section 85 is sometimes referred to as a amplifier muting signal and applied to opamp 107 (and opamp 105) of FIG. 2 to limit or remove the supply voltage to the integrated audio opamp 103 as will be explained in more detail. This can conveniently be the same muting circuit used to mute the amplifier while the power supply is first charging. In this manner the power supply is allowed to keep running and cooling fans remain operative while the amplifier cools down. Power supply shutdown is reserved for abnormal conditions where temperature continues to rise.

In summary, the thermal circuit 71 in conjunction with the comparator 85 supplies an amplifier muting signal to the amplifier when the temperature of the amplifier (and power transformer) reaches a first overheated condition to allow the amplifier to cool down without removing power to auxiliary loads. The thermal circuit 71 in conjunction with OR gates 73, 77 and the one shot trigger 75 supplies a shut down command or switching elements inhibit signal to inhibit the drive circuit 69 when the temperature of the amplifier reaches a second overheated condition which is greater than the first overheated condition.

Another shutdown signal comes from overvoltage comparator 78. The control circuitry is powered by a small unregulated power supply 22. Excessive AC voltage, which might cause the voltage rating of the switches to be exceeded, exceeds the voltage of zener diode Z1 and raises the comparator voltage above a convenient voltage reference such as 5V. With both switches turned off, their withstand voltage is effectively in series, doubling their effective breakdown voltage.

A power supply overcurrent shutdown input to the OR gates 77 and 73 comes from the overcurrent comparator 79. This enables the one shot 75 to also respond to an overcurrent shutdown, allowing a time delay for the high frequency switching elements Q1, Q2, to cool down before restarting. The overcurrent comparator 79 responds to output from the current transformer CT-1, which is rectified by diodes D13 thru D16, and appears as a voltage on R1. When this voltage (representing the transformer current) exceeds the reference voltage to comparator 79, a supply shutdown occurs. As noted above, this reference voltage is initially low, but reaches a high steady state value after C12 is fully charged. It should, however, be noted that power supply shutdown, followed by the normal soft-start cycle with several seconds of muting, is not a desirable response to normal short term program peaks, so the steady state threshold for internal power supply shutdown must be set at a value greater than the maximum peak power of the amplifier, which is in excess of the supply's thermally limited current rating. Therefore, in the present invention this voltage (voltage across R1) is also sent to the amplifier current limiting circuit 83, where intermediate levels of overcurrent cause the muting circuit to progressively reduce the amplifier's current limit until power supply current is returned to normal (see FIG. 2). This action occurs with a short time delay, due to an RC integrator in the current limiter 83, so that program peaks can pass through the amplifier without triggering current limiting. In this manner the amplifier circuitry is made to compensate for the inherent lack of flexibility associated with this supply topology, effectively restoring the ability to deliver at least partial power to loads greater than the long term rating. The muting and current limiting signals may conveniently be coupled to a circuit for short circuit current limiting, as disclosed in U.S. Pat. No. 4,321,554.

Another shutdown signal can come from an external contact (not shown) which can permit the user to remote control the power to the amplifier with a simple low voltage contact closure.

FIG. 2 shows a preferred embodiment of the audio amplifier, which uses a known circuit with grounded output device collectors for simpler heat sink mounting. This audio circuit requires isolated floating power supply voltages for each channel. The good cross regulation between sections, and minimal parts count of each isolated output section, supports this embodiment.

A single representative audio channel is shown, connected to power supply terminals 31, 33, 35, 37, and 39. The high power output transistors are represented by Q20 and Q21; additional devices can readily be connected in parallel to meet the power handling needs of particular circuits. The collectors of Q20 and Q21 are connected in common, and may conveniently be mounted to a common grounded heat sink, without requiring the usual insulating film. The emitters of Q20 and Q21 are connected, via power diodes D30, D31 to the lower power supply voltage rails 33 and 37. Q10 and Q11 supply drive current in alternation to Q20, Q21, causing the opposing rails of the power supply to alternatively be pulled towards ground with sufficient current to drive the load, effectively superimposing the desired audio voltage swing on the DC voltages of the supply. Switching transistors Q40 and Q41 are connected to the upper supply rails, 31 and 39, and are controlled by drive circuitry 100, 101 such that the upper rail voltages are added in series with the lower voltages whenever the output transistors Q20, Q21 approach saturation. In this manner, Q20, Q21 draw from a lower voltage supply, reducing their power losses, until the higher voltage supply is actually required for full output signals. Since all supply rails 31, 33, 35, 37, 39 are capacitively coupled, with voltages between them maintained at a constant value by the power supply (FIG. 1), the audio voltage imposed on the rails by the alternating action of Q20, Q21 appears at the power supply center tap 35, with no DC offset, and is coupled to the audio output terminal. The load currents are returned to the audio ground, being in common with the collectors of Q20, Q21, thus completing the audio power circuit.

The input voltage and current for Q10, Q11 are conveniently supplied by a low voltage integrated operational amplifier 103, via bias diodes D12, D13 which offset the junction voltages of Q10, Q11 and assure smooth joining of the positive and negative halves of the audio waveform. The opamp is powered by supply voltages 110 and 111, which are resistively coupled to the main rails by R32 and R33, and filtered by C21 and C22, which have a time constant greater than the lowest audio frequency of interest, and with voltage limited by zeners Z10 and Z11 to a value within the opamp's rating, for example +15V and −15V. Feedback circuitry represented by R23 and R24 ensure linear performance at the output despite semiconductor variances and the effects of switching the rail voltages. Audio input signals are received, normalized, and presented to the feedback network in the circuit block 109. The amplifier described here is shown in a simplified schematic form; various enhancements of the feedback circuit, crossover bias network, interstage coupling, and lag compensation, to obtain greater bandwidth, linearity, and stability are known to those of ordinary skill in the art.

The maximum current in Q10–Q20 and Q11–Q21 is limited by the value of R30 and R31 respectively, which are selected to supply enough current to drive the output transistors to their intended peak current into valid loads. The peak current of opamp 103 is not material, so long as it exceeds the currents in R30 and R31, as D12 or D13 becomes reverse biased when the opamp supplies currents greater than those available from R30 or R31. Since the available current through R30, R31 is dependent on the voltages 110, 111, we can vary these voltages to cause muting and current limiting of the amplifier.

U.S. Pat. No. 4,321,554 discloses a method to vary this voltage to effect short circuit current limiting after a brief delay. The present invention adds two additional inputs to control this voltage and hence the current limit. Q30 and Q31 clamp the opamp supply rails 110, 111 to ground, the current to said rails being limited by R32 and R33. Q30 and Q31 are driven by circuitry comprising two opamps 105 and 107, with matched resistors R42 and R43 arranged so that opamp 105 inverts the signal from 107, and drives Q30, and 107 connected so that a positive signal at its inverting input drives Q31, resulting in simultaneous conduction of both transistors in response to input trigger signals. This reduces the opamp rails equally, thus enabling the current limit of the amplifier to be reduced as desired, including the possibility of complete cutoff by fully saturating Q30 and Q31.

The values of R44, R45 and R46 are arranged so that the response to input from circuit block 85 (muting signal resulting from an amplifier overheat condition) is more sensitive than an input from block 83 (muting signal resulting from a power supply overcurrent condition), for instance by making R45 much smaller than R46. A signal output from block 85, representing a desire to mute the amplifier, should be in the form of a definite threshold, for example, a positive logic signal, and results in Q30 and Q31 being fully driven, reducing the amplifier current output to zero and hence muting it. A signal from block 83 is made to be a voltage substantially proportional to the current sensed in the power supply, as explained above in FIG. 1; the value of R46 is set so this voltage partially triggers Q30 and Q31 in proportion to the current signal above a certain threshold, thus proportionally reducing the current limit of the amplifier until the load on the power supply stabilizes at its long term limit. The resistors R44, R45, and R46 in conjunction with the opamps 105 and 107 effectively function as a comparator to compare the transformer current responsive signal in the output of current limiter 83 with a desired threshold value. As noted in the description of FIG. 1, a delayed response in block 83, in the form of an R-C integrator, permits full power to flow briefly before current limiting is imposed. The muting scheme described here is shown in a simplified schematic form; various enhancements to offset the effects of mismatched beta in Q30 and Q31, and to obtain more precise degrees of current limiting, are obvious to those of ordinary skill in the art.

FIG. 2 also shows one embodiment of a DC fault detection circuit. A shut down circuit 91 includes an input 93 which is connected to the output of the audio amplifier, 35. A resistor R2 and capacitor C13 form a ground referenced integrator with a time constant set to reach about 2 volts after the amplifier has delivered full scale DC for a fraction of a second, but to remain below 2V for full scale outputs at frequencies above 20 Hz. The integrator arrangement effectively measures the magnitude of volts seconds in the amplifier output. A bridge rectifier D17 thru D20 couples either polarity of DC threshold voltage into the base and emitter of Q3 so that it is turned on at a threshold of about 2 volts. The resulting current is coupled by D21 into circuit block 81 and thence to the power supply shutdown circuit.

FIG. 3 shows the pulse train from comparator 65 into drive circuit 69.

FIG. 4 shows the gate drive signal from drive circuit 69 into W3.

FIG. 5 shows the resulting drive signal for Q1.

FIG. 6 shows the resulting drive signal for Q2.

FIG. 7 shows the resulting voltage from Q1 and Q2, into the transformer 21.

FIG. 8 shows the resulting current waveform through C3 and transformer 21.

NOTE: in FIGS. 3 thru 8, the "dead time", 99, is shown larger than normal for clarity.

The following table lists one set of values for the components of FIG. 1. It is understood that different components may be used and that the power supply can be scaled for different power requirements, frequency requirements and different output voltage requirements.

TABLE I

| Component ID number | Description |
| --- | --- |
| C1, C2 | 4400 microfarads - 200 V |
| C3 | 0.94 microfarads - 400 V |
| C4, C5, C6, C7 | 940 microfarads - 63 V |
| C8, C9, C10, C11 | 940 microfarads - 63 V |
| C12 | 10 microfarads - 25 V |
| D1, D2, D3, D4 | 40 A - 400 V diodes |
| D51, D52 | MUR440 |
| D9, D12 | SF164A |
| D10, D11 | SF164C |
| D5, D8 | SF166A |
| D6, D7 | SF166C |
| D13, D14, D15, D16 | 1N4934 |
| Q1, Q2 | IRGPC50U |
| R1 | 15 ohms, 1 watt |
| Comparator 65, 79 | LM393 |
| Crystal Osc. 61 | 7.3728 MHz |
| Divider 63 | 74HC4024 |
| Drive circuit 69 | SG3525 |

It should be noted that the ratio of the capacitance values of a primary charge storage capacitors C1 or C2 to the secondary storage capacitors, e.g., C5, between a rail and a common terminal, is about 5:1. As a result, the time constant of the primary charge storage capacitor is several times longer than the time constant of the secondary charge storage capacitor.

The following table lists one set of values for the components of FIG. 2. It is understood that different components may be used and that the audio amplifier can be scaled for different power requirements, frequency requirements and different output voltage requirements.

TABLE 2

| Component ID number | Description |
| --- | --- |
| C13 | 220 uF 10 V nonpolar |
| C21, C22 | 330 uF, 25 V |
| D12, D13, D17, D18, D19, D20, D21 | 400 ma, 75 V, 1N4148 |
| D30, D31 | 15 A, 100 V, fast recovery, MUR1510 |
| Q4, Q30, Q31 | General purpose transistor, 100 ma 40 V |
| Q10 | NPN 8 A, 150 V, MJE15030 |
| Q11 | PNP 8 A 150 V, MJE15031 |
| Q20 | PNP 15 A 200 V, MJ15023 |
| Q21 | NPN 15 A, 200 V, MJ15022 |
| Q40, Q41 | N channel, 50 A, 60 V, MTP50N06E |
| R2 | 10K, 2 watts |
| R10, R11 | 3.3 ohm, 1 W |
| R12, R13 | 22 ohm, 1 W |
| R20, R21 | 0.15 ohm, 5 W |
| R23 | 1K, 1/4 W |
| R24 | 20K, 1 W |
| R30, R31 | 1.8K, 1/4 W |
| R32, R33 | 1.5K, 5 W |
| R40, R41, R42, R43 | 10K, 1/4 W |
| R44 | 100K, 1/4 W |
| R45 | 1K, 1/4 W |
| R46 | 10K, 1/4 W |
| Z10, Z11 | 15 V, 1 W, 1N4744A |
| opamp 103, 105, 107 | 5532 |
| Voltages 31, 33, 35, 37, 39 | +75, +37, 0, -37, -75 |

While the present invention has been described in terms of a high frequency power supply coupled with an audio frequency amplifier, one skilled in the art will realize that the structure and techniques of the present invention can be applied to many appliances. The present invention may be applied in any situation where high frequency transformance of power is desired for bulk purposes, or where post-regulation is contemplated.

Although the invention has been derived with reference to particular illustrative embodiments thereof, many changes and modifications of the invention may become apparent to those skilled in the art without departing from the spirit and scope of the invention or defined in the appended claims.

What is claimed is:

1. A fixed frequency discontinuous resonant power supply for audio amplifiers comprising:

a source of rectified direct current voltage;

at least one primary charge storage capacitor connected across the voltage source;

an isolation transformer having a primary and at least one secondary winding;

a series resonance capacitor;

a pair of high frequency switching elements operating at a fixed frequency in a push pull mode with each switching element alternately providing an open and closed circuit, the primary winding, the series resonance capacitor and each switching element when operating in the closed condition being connected in series with the voltage source;

a direct current output section for providing power to the audio amplifier and having at least one output rail and a common output terminal;

at least one secondary charge storage capacitor connected between the rail and the common terminal of the output section;

secondary rectifying means connected between the secondary winding of the transformer and the output section for providing a direct current output voltage between the rail and the common terminal;

the series resonance capacitor forming a resonant circuit, at about the switching frequency, with the leakage inductance between the primary and secondary windings of the isolation transformer and any inductance in series with the transformer windings, whereby the current through the series resonant circuit will be substantially zero when each switching element transits from a closed to an open circuit condition.

2. A fixed-frequency discontinuous resonant power supply with at least one isolated secondary output voltage channel supplying voltage to a class H power amplifier, comprising:

a source of rectified direct current voltage;

at least one primary charge-storage capacitor connected across the voltage source;

an isolation transformer having primary and at least one isolated center-tapped secondary winding with at least two symmetrical intermediate voltage taps;

a series resonant capacitor;

a pair of high frequency switching elements operating at a fixed frequency in a push-pull mode with each switching element alternately providing an open and closed circuit, the primary winding, the series resonant capacitor, and each switching element when operating in the closed condition being connected in series with the voltage source;

at least one isolated direct current output section, the output section having a full positive and negative output voltage rail, an intermediate positive and negative output voltage rail and a common output terminal, the common output terminal being connected to the center tap of the secondary winding, the output section providing full and intermediate positive and negative power supply rail voltages to a channel of audio amplification;

at least one secondary charge-storage capacitor connected between each voltage rail and the common terminal;

secondary rectifying means connected between the secondary winding of the transformer and the direct current output section for providing a direct current charging voltage between each voltage rail and the common terminal;

the series resonant capacitor forming a resonant circuit, at about the switching frequency, with the inductance comprising the leakage inductance between the primary and secondary windings of the isolation transformer and any inductance in series, with the transformer windings, whereby the current through the series resonant circuit will be substantially zero when each switching element transits from a closed to an open circuit condition;

an audio power amplifier coupled to the output section and having a complementary-symmetry, grounded-collector transistor output circuit, the collectors of the transistors being connected directly to a common ground;

a diode individually connected between the intermediate positive and negative voltage rails and an emitter electrode of a respective transistor so that the emitter of one transistor is positive and the emitter of the other transistor is negative;

the amplifier further including voltage switching means for alternatively coupling the positive and negative emitters of the output transistors to the full positive and negative rail voltages as required to accommodate the voltage swing of the output signal, while reverse biasing the coupling diodes connected between the emitters of the respective transistors and the intermediate voltage rails;

the amplifier having a speaker output voltage terminal connected to the center tap, the center tap being driven positive and negative by the output transistors pulling towards ground, and returned to the common ground.

3. The invention of claim 2 wherein the switching frequency is at least 100 kHz.

4. A combined fixed frequency discontinuous resonant power supply and an audio power amplifier having at least one channel with a controllable peak output current limit comprising:

a source of rectified direct current voltage;

at least one primary charge-storage capacitor connected across the voltage source;

an isolation transformer having a primary and at least one secondary winding;

a series resonant capacitor;

a pair of high frequency switching elements;

a switching control circuit, the control circuit, when not inhibited, controlling the switching elements to operate at a fixed frequency in a push-pull mode with each switching element alternately providing an open and closed circuit, the primary winding, the series resonant capacitor, and each switching element when operating in the closed condition being connected in series with the voltage source;

a direct current output section for providing power to the audio amplifier and having at least one output rail and a common output terminal;

at least one secondary charge-storage capacitor connected between the rail and the common terminal of the output section;

secondary rectifying means connected between the secondary winding of the transformer and the output section for providing a direct current output voltage between the rail and the common terminal;

the series resonant capacitor forming a resonant circuit, at or slightly above, the switching frequency, with the inductance comprising the leakage inductance between the primary and secondary windings of the isolation transformer and any inductance in series with the transformer windings, whereby the current through the series resonant circuit will be substantially zero when each switching element transits from a closed to an open circuit condition;

an audio amplifier having an audio input and at least one output channel connected between the output rail and the common terminal of the output section, the amplifier including means for controlling the peak output current independently of the level of the audio input.

5. The invention of claim 4 wherein the switching control circuit includes a crystal controlled oscillator.

6. The invention of claim 5 wherein the switching control circuit further includes a frequency divider/sawtooth wave generator, a control voltage source, and a comparator, the divider/sawtooth generator being connected in series with the oscillator so that the output signal from the divider/sawtooth generator has a frequency that is twice the frequency of the switching frequency, the comparator being arranged to compare the instantaneous level of the divider/sawtooth generator output voltage with the control voltage and provide a pulse train output signal at twice the switching frequency and having a duty cycle determined by the level of the control voltage.

7. The invention of claim 4 wherein the switching control circuit further includes a gate drive transformer having a primary winding and a pair of isolated secondary windings coupled to the respective switching elements, gate drive signal generating means for supplying a stepped gate drive signal to the gate drive transformer primary, the drive signal having a positive state, when the first switching element is conducting and the second switching element is nonconducting, a zero state, when both elements are nonconducting, and a negative state, when the second switching element is conducting and the first is nonconducting.

8. The invention of claim 7 wherein the gate drive signal generating means includes a crystal oscillator, a divider/sawtooth wave generator coupled thereto for proving a sawtooth output voltage of twice the frequency of the switching frequency, a reference control voltage and a comparator for comparing the sawtooth output voltage with the instantaneous value of the control voltage and for generating a gate drive train signal having about a 90% duty cycle when the control voltage is set at a normal operating value and a drive circuit coupled between the output of the comparator and the gate drive transformer primary winding for steering alternating pulses of the drive train signal to opposite ends of the primary winding whereby the waveform across the primary winding has a positive voltage for about 45% of the switching period, a substantially zero voltage for 5% of the period, a negative voltage for about 45% of the period and a substantially zero voltage for the remaining 5% of the period whereby each switching element is conducting for a duration of about 45% and off for about 5% of the switching period.

9. The invention of claim 8 further including means to ramp the control voltage gradually up from zero when first starting the supply in order to progressively charge the storage capacitors without excessive inrush currents.

10. The invention of claim 9 wherein the rectified DC source includes an AC source and rectifying means for providing the rectified DC voltage and further including:
an overvoltage shutdown circuit comprising:
a rectifier connected to the AC source for providing an unregulated DC voltage representative of the AC source voltage;
a DC reference voltage source; and
a comparator coupled to the drive circuit and responsive to the difference between the DC reference voltage and the unregulated DC voltage for inhibiting the switching control circuit when said difference is a preset value.

11. The invention of claim 4 wherein the secondary winding includes a center tap forming the common terminal of the output section and wherein said at least one output rail comprises at least one positive and one negative voltage rail whereby the output section generates balanced tracking positive and negative power supply voltages, the output channel of the audio amplifier being connected between the output voltage rails.

12. The invention of claim 4 wherein the switching circuit is arranged to operate the elements at a frequency of at least 100 kHz.

13. The invention of claim 4 further including a saturable secondary inductor connected in series with the secondary rectifying means and the transformer secondary winding, the secondary inductor having an inductance no greater than the leakage inductance of the isolation transformer.

14. The invention of claim 4 wherein the time constant of the primary charge-storage capacitor is several times longer than the time constant of the secondary charge-storage capacitor.

15. The invention of claim 14 further including an maximum overcurrent protective circuit comprising:
a transformer current responsive element for providing a transformer current responsive voltage representative of the current flow through the primary winding of the isolation transformer;
an overcurrent reference voltage source;
a comparator for comparing the current responsive voltage with the overcurrent reference voltage and for applying an inhibit signal to the switching control circuit when the current responsive voltage exceeds the reference voltage.

16. The invention of claim 15 wherein the amplifier output channel includes a pair of semiconductor output devices for delivering power to a load and further including an intermediate overcurrent protective circuit comprising:
a integrator coupled to the transformer current responsive element for providing an average transformer current responsive voltage;
means for comparing the average transformer current responsive voltage to an intermediate threshold reference value which is less than the maximum threshold reference voltage and for limiting the current drawn by the semiconductor output devices when the average transformer responsive voltage exceeds the threshold value.

17. The invention of claim 16 wherein the amplifier output current limiting means is arranged to control the drive to semiconductor output devices independently of the audio input.

18. The invention of claim 15 further including means for maintaining the inhibit signal for a predetermined time interval to allow the high frequency switching elements to cool prior to a restart.

19. The invention of claim 18 including means to ramp up the overcurrent reference voltage from zero during the transient condition of the power supply start-up, thereby permitting overcurrents caused by component faults to be detected at a relatively low, safe current.

20. The invention of claim 19 wherein the amplifier output channel includes a pair of output semiconductor devices for delivering power to the load and further including means for inhibiting the output devices during the time that the overcurrent reference voltage is being ramped up.

21. The invention of claim 4 further including a amplifier DC fault protection circuit comprising:
an amplifier DC output sensing circuit coupled to the output of the amplifier for providing a DC fault voltage representative of the magnitude of the DC voltage in the amplifier output after said DC voltage has existed a preset time; and
a comparator for comparing the DC fault voltage with a reference voltage and for applying an inhibit signal to the switching control circuit when said DC fault voltage exceeds the reference voltage.

22. The invention of claim 21 wherein the output DC sensing circuit includes an integrator and a peak detector for detecting the DC volts seconds in the amplifier output.

23. The invention of claim 21 further including:
a DC detector comprising an integrator and peak rectifying circuit connected to the amplifier output for providing an output signal representative of the volts seconds in the amplifier output;
a threshold reference voltage source; and
a comparator for comparing the threshold reference voltage with the output signal from the integrator and peak rectifying circuit and for inhibiting the switching control circuit and resetting the overcurrent reference voltage in response to a preset difference between said voltages.

24. The invention of claim 23 further including means for maintaining the inhibit signal for a predetermined time interval to allow the high frequency switching elements to cool prior to a restart.

25. The invention of claim 4 wherein the amplifier output channel includes a pair of semiconductor output devices for delivering power to a load and a muting circuit responsive to a muting signal for reducing the drive to the output devices and further including an over temperature amplifier muting circuit comprising:

- at least one thermal sensor for providing an amplifier temperature signal representative of the temperature of the amplifier;
- a comparator for comparing the amplifier temperature signal with a first threshold value and for generating an amplifier muting signal when the temperature signal exceeds the first threshold value.

26. The invention of claim 25 wherein the amplifier muting circuit is arranged to remove all drive to the amplifier output devices in response to the muting signal whereby the amplifier is allowed to cool down.

27. The invention of claim 25 further including means responsive to the amplifier temperature signal and a second threshold value, higher than the first value, for inhibiting the switching control circuit.

28. The invention of claim 4 wherein the amplifier peak current controlling means comprises a zener diode connected between the output rail and the common terminal.

29. The invention of claim 28 further including an explicit inductor connected in series with the series resonant capacitor.

* * * * *